United States Patent
Tamaki (10) Patent No.: US 11,330,703 B2
(45) Date of Patent: May 10, 2022

(54) WIRELESS COMMUNICATION SYSTEM AND COMPUTER TOMOGRAPHY APPARATUS

(71) Applicant: CANON KABUSHIKI KAISHA, Tokyo (JP)

(72) Inventor: Hiroto Tamaki, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/073,121

(22) Filed: Oct. 16, 2020

(65) Prior Publication Data

US 2021/0127480 A1    Apr. 29, 2021

(30) Foreign Application Priority Data

Oct. 25, 2019   (JP) .............................. JP2019-194729

(51) Int. Cl.
*H05K 1/02* (2006.01)
*G01T 1/29* (2006.01)

(52) U.S. Cl.
CPC ......... *H05K 1/0245* (2013.01); *G01T 1/2985* (2013.01); *H05K 2201/056* (2013.01)

(58) Field of Classification Search
CPC ........................................... H05K 1/0237–025
See application file for complete search history.

(56) References Cited

FOREIGN PATENT DOCUMENTS

| JP | H08-224233 A | 9/1996 |
|---|---|---|
| JP | 2017-118476 A | 6/2017 |

*Primary Examiner* — Jeremy C Norris
(74) *Attorney, Agent, or Firm* — Canon U.S.A., Inc. IP Division (57) ABSTRACT

A wireless communication system includes a first differential signal line, a differential coupler, and an electronic circuit. The differential coupler has a second differential signal line to perform wireless communication of a differential signal with the first differential signal line via electromagnetic field coupling. The electronic circuit is connected to the differential coupler via a wired transmission path to process the differential signal. A surface of a board or a ground pattern of the electronic circuit is inclined or upright with respect to the second differential signal line so as to separate away from a direction in which the first differential signal line extends.

11 Claims, 7 Drawing Sheets

F I G. 2B
INCLINATION ANGLE=5°

F I G. 2D
INCLINATION ANGLE=15°

F I G. 2F
INCLINATION ANGLE=90°

F I G. 2A
INCLINATION ANGLE=0°

F I G. 2C
INCLINATION ANGLE=10°

F I G. 2E
INCLINATION ANGLE=30°

United States Patent US 11,330,703 B2

WIRELESS COMMUNICATION SYSTEM AND COMPUTER TOMOGRAPHY APPARATUS

BACKGROUND

Technical Field

One disclosed aspect of the embodiments relates to a wireless communication system and a computer tomography (CT) apparatus.

Description of the Related Art

Recently, in the field of medical devices, industrial robots and the like, there are an increasing number of devices that have a fixed portion and a movable portion that performs translational motion, rotational motion, and the like, relative to the fixed portion, in addition to performing high-speed and large-capacity data transmission of image signals and the like between the fixed portion and the movable portion. For example, in a CT apparatus, a large number of X-ray images are captured at various angles of rotation by an image capturing unit provided on a rotation unit (movable portion) inside a gantry. The X-ray image obtained by image capture is transferred to a computer provided in the fixed portion and processed according to a predetermined algorithm so as to generate an image for diagnosis or inspection. Therefore, in the CT apparatus, a large number of X-ray images are transferred from the movable portion to the fixed portion.

Japanese Patent Laid-Open No. 08-224233 (hereinafter, Patent Literature 1) discloses a communication system that performs data communication between a rotation unit and a fixed portion in such a CT apparatus. The communication system described in Patent Literature 1 includes: a differential transmission path positioned and attached substantially along a generally annular rotation frame; and a differential coupler attached to the fixed frame. The differential coupler is positioned and provided sufficiently close to the differential transmission path so that it can receive signals applied to the differential transmission path via wireless coupling to the differential transmission path.

Japanese Patent Laid-Open No. 2017-118476 (hereinafter, Patent Literature 2) discloses a contactless communication module having provided, at different heights, an antenna for performing contactless communication; and a semiconductor component having an element for processing signals received or transmitted via the antenna. According to the aforementioned configuration, it becomes possible to shorten the distance between the partner communication device and the antenna, whereby improvement in communication performance is expected.

However, Patent Literature 1 discloses a structure in which a differential coupler and a reception circuit are connected along a coaxial line. In such a connection structure, there is a risk that parasitic components along the coaxial wiring line may cause distortion in signals transmitted between the differential coupler and the reception circuit, whereby an error may occur in data transmitted from the rotation unit to the fixed portion of the CT apparatus. Similar problems may occur in a system that performs wireless communication using electromagnetic field coupling, without being limited to systems that perform communication between fixed portions and rotation units.

Figure 8A:
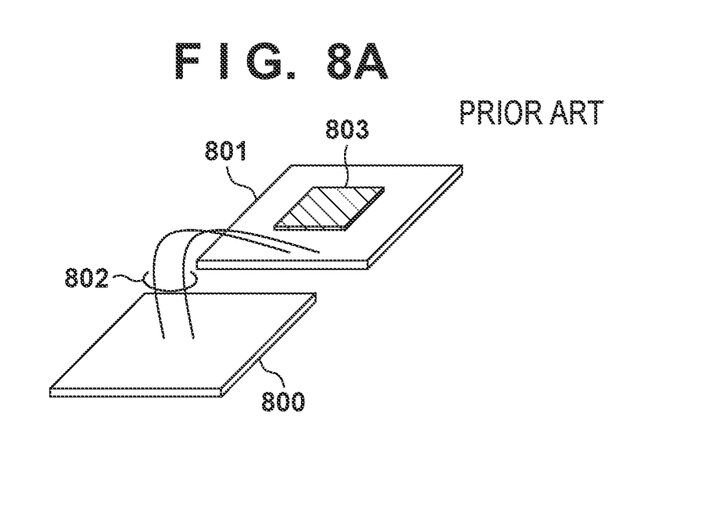
FIGS. 8A to 8B are explanatory diagrams of a problem with the wireless communication system according to prior art.

For example, as illustrated in FIG. 8A, in a structure in which a differential coupler 800 and a reception circuit 801 are connected via a coaxial wiring 802 (structure according to Patent Literature 1), wireless signals being transmitted may experience distortion due to parasitic components of the coaxial wiring 802. As a result, there is a problem that the quality of communication between the differential coupler 800 and the reception circuit 801 may degrade, whereby it becomes difficult to realize high-speed communication (e.g., communication with a transmission rate of about 10 Gbps).

In addition, Patent Literature 2 describes a contactless module integrally formed of an antenna and a reception circuit having semiconductor components or the like. According to the technique of Patent Literature 2, it becomes possible to provide an antenna (differential coupler) and a reception circuit in close proximity to each other, whereby it becomes possible to reduce the effect of parasitic components generated in signals transmitted between the antenna and the reception circuit. However, applying the contactless module of Patent Literature 2 to the differential coupler of Patent Literature 1 gives rise to the following problem. Specifically, electromagnetic field coupling generated between a reception circuit (semiconductor component, chip component, signal wiring, ground pattern (GND pattern), or the like) provided close to the antenna of the contactless module and the transmission path may distort the signal waveform, thereby degrading the communication performance.

Figure 8B:
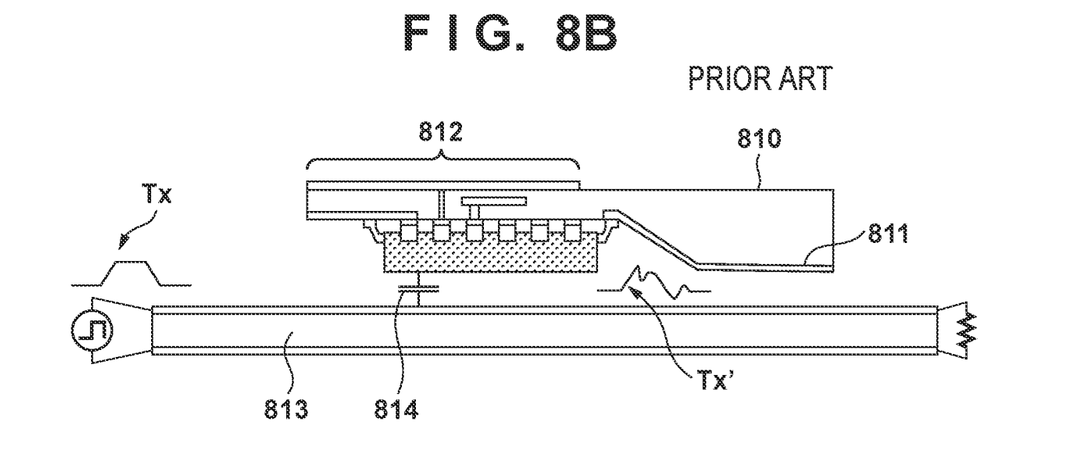

For example, as illustrated in FIG. 8B, using a contactless module 810 (structure based on Patent Literature 2) integrally formed of an antenna 811 and a reception circuit 812 such as a semiconductor component allows for providing the antenna 811 and the reception circuit 812 in proximity to each other as a differential coupler. The contactless module 810 allows for reducing the effect of parasitic components generated during communication between the antenna 811 and the reception circuit 812, whereby it becomes possible to increase the speed of wireless communication in comparison with the configuration of FIG. 8A. However, the configuration of FIG. 8B results in occurrence of a coupling 814 between the reception circuit 812 (such as a semiconductor component, chip component, signal wiring, ground pattern (GND pattern), etc.), provided close to the antenna 811 of the contactless module 810, and a transmission path 813. The coupling 814 causes a signal waveform Tx to distort like a signal waveform Tx', which is received by the antenna 811 in turn, and therefore the problem with the communication performance still remains.

SUMMARY

According to one aspect of the embodiments, a wireless communication system includes a first differential signal line, a differential coupler, and an electronic circuit. The differential coupler has a second differential signal line to perform wireless communication of a differential signal with the first differential signal line via electromagnetic field coupling. The electronic circuit is connected to the differential coupler via a wired transmission path to process the differential signal. A surface of a board or a ground pattern of the electronic circuit is inclined or upright with respect to the second differential signal line so as to separate away from a direction in which the first differential signal line extends.

According to another aspect of the embodiments, a computer tomography apparatus includes a radiation generator, a radiation detector, a rotation unit, a fixed portio, and a wireless communication system. The radiation detector is configured to detect radiation generated by the radiation generator. The rotation unit is configured to rotate the radiation generator and the radiation detector while holding the same in a state facing each other. The fixed portion is configured to support the rotation unit. The wireless communication system includes a first differential signal line, a differential coupler, and an electronic circuit. The differential coupler has a second differential signal line to perform wireless communication of differential signals with the first differential signal line via electromagnetic field coupling. The electronic circuit is connected to the differential coupler via a wired transmission path to process the differential signals. A surface of a board or a ground pattern of the electronic circuit is inclined or upright with respect to the second differential signal line so as to separate away from the direction in which the first differential signal line extends. The first differential signal line is provided along a circumference centered on a rotation axis of the rotation unit. The differential coupler is provided on the fixed portion. A signal detected by the radiation detector is transmitted to the fixed portion via electromagnetic field coupling between the first differential signal line and the second differential signal line.

Further features of the disclosure will become apparent from the following description of exemplary embodiments with reference to the attached drawings.

DESCRIPTION OF THE EMBODIMENTS

Hereinafter, embodiments will be described in detail with reference to the attached drawings. Note, the following embodiments are not intended to limit the scope of the disclosure. Multiple features are described in the embodiments, but limitation is not made an embodiment that requires all such features, and multiple such features may be combined as appropriate. Furthermore, in the attached drawings, the same reference numerals are given to the same or similar configurations, and redundant description thereof is omitted.

First Embodiment

A wireless communication system according to respective embodiments described below solves such the problems in the prior art, thereby improving communication quality and realizing high-speed communication.

Figure 1A:
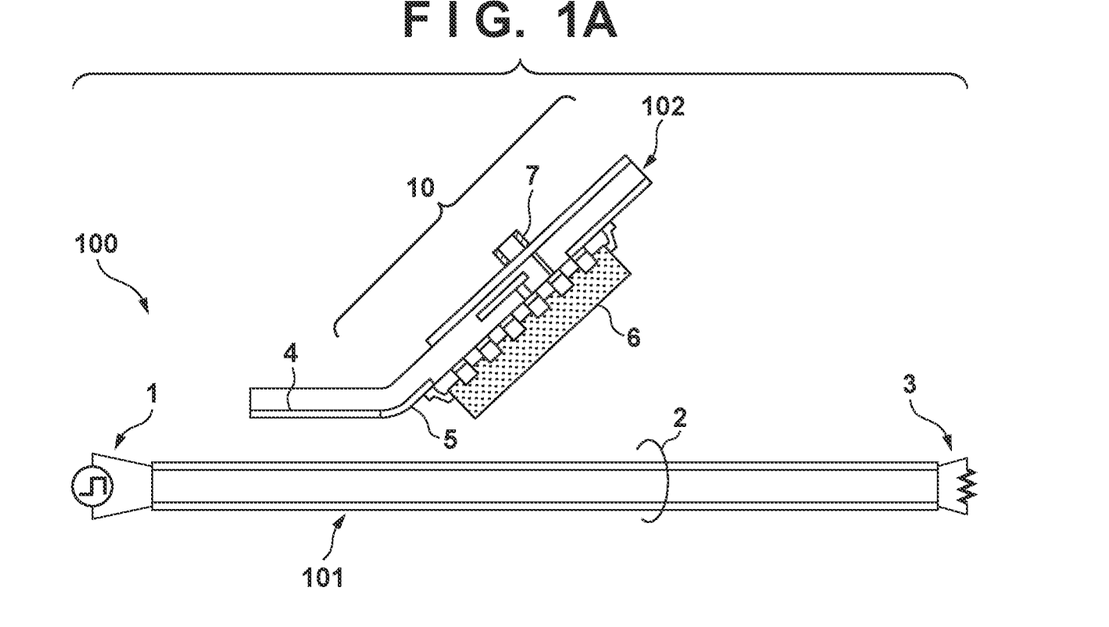
FIGS. 1A to 1C illustrate exemplary configurations of a wireless communication system according to a first embodiment.
Figure 1B:
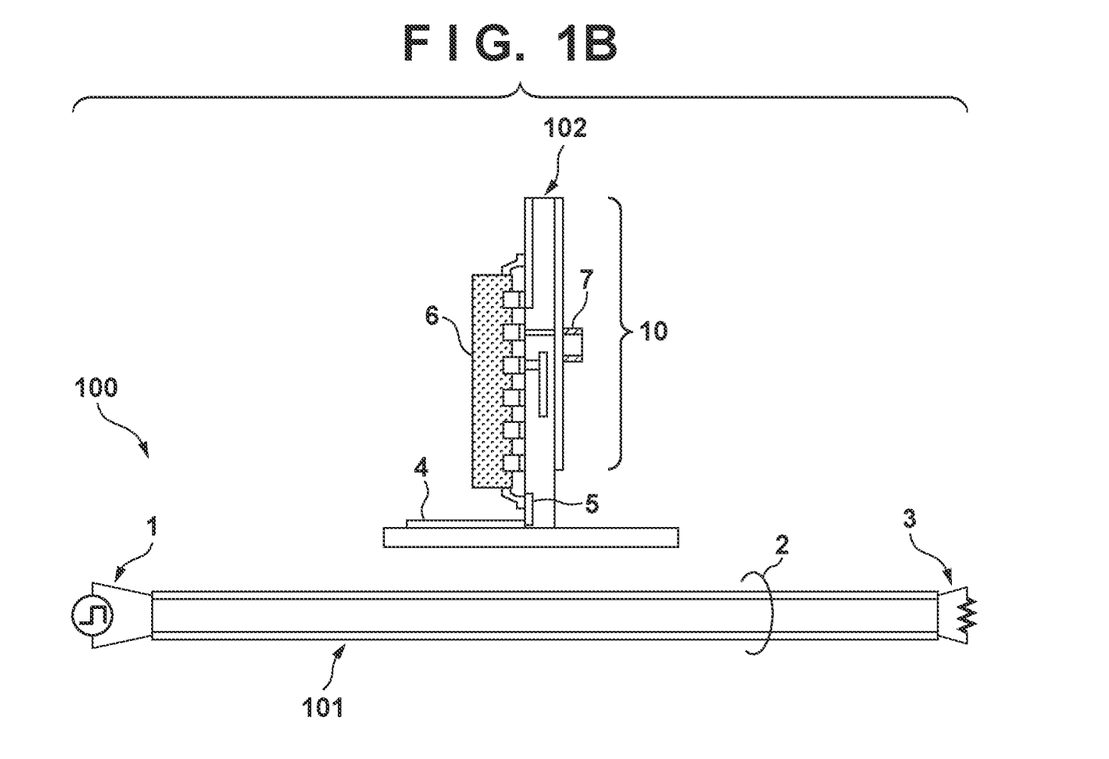
Figure 1C:
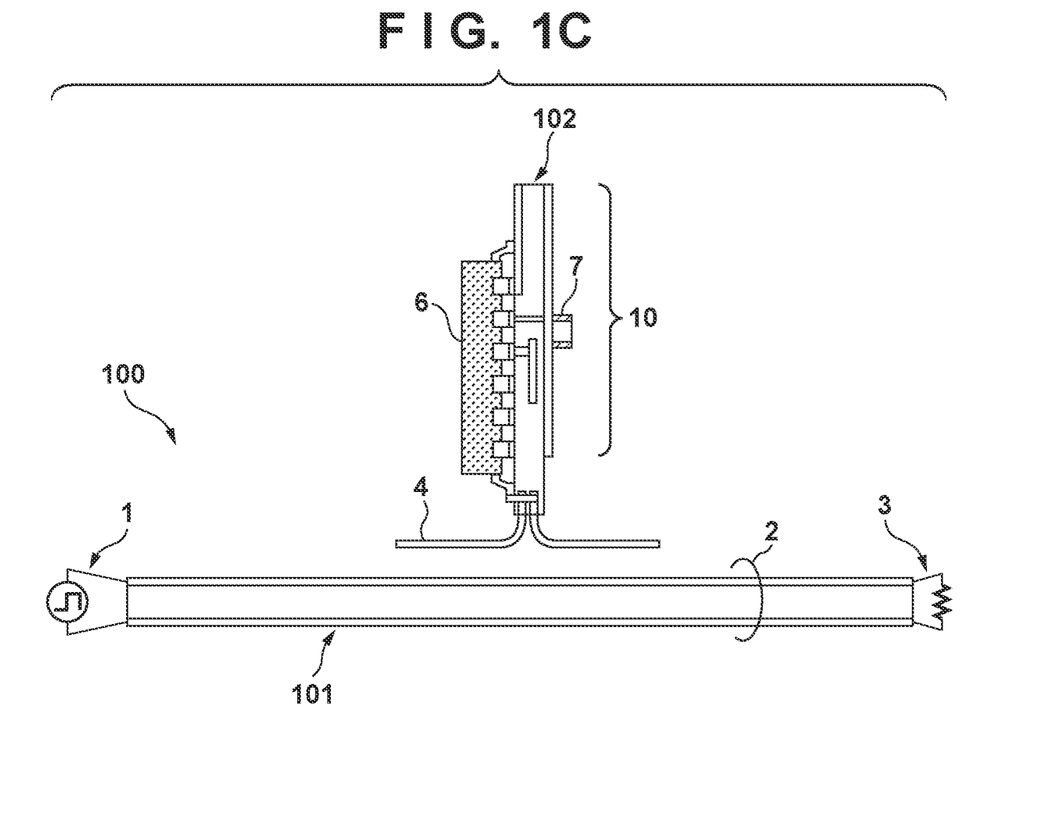

FIGS. 1A to 1C illustrate exemplary configurations of a wireless communication system 100 including a transmitter and a receiver according to a first embodiment. A transmitter 101 has a pair of differential signal lines (first differential signal lines) and also has: a differential transmission path 2 that functions as a transmission coupler; and a transmission circuit 1 connected to one end of the differential transmission path 2. The other end of the differential transmission path 2 is terminated by a terminating circuit 3. A receiver 102 has a pair of differential signal lines (second differential signal lines) and also has: a differential coupler 4 that functions as a reception coupler and a reception circuit 10 connected to the differential coupler 4 via a wired transmission path 5. As described above, the transmission coupler and the reception coupler of the first embodiment are formed of the differential transmission path 2 and the differential coupler 4 and provided so that the pairs of differential signal lines included in respective couplers face each other.

The transmission circuit 1, which is an example of an electronic circuit connected to the differential transmission path 2 to perform differential signal processing, outputs differential signals to the pair of differential signal lines of the differential transmission path 2. The transmission circuit 1 may have an amplifier, an attenuator, and various filter circuits as necessary. Furthermore, it is also possible to transmit differential signals to a plurality of transmission couplers simultaneously, provided that the transmission circuit 1 has a distributor or the like for distributing differential signals. The differential signals output from the transmission circuit 1 are received by the reception circuit 10 via the differential transmission path 2 and the differential coupler 4 being in an electromagnetic field coupling state. The differential coupler 4 and the reception circuit 10 form the receiver 102.

The reception circuit 10, which is an example of an electronic circuit connected to the differential coupler 4 to perform processing of differential signals, has a function of shaping the received wireless signal into a desired digital signal waveform and outputting the latter. For example, the reception circuit 10 receives, via the transmission path 5, a differential voltage received by the differential coupler 4 from the pair of differential signal lines of the differential coupler 4. The reception circuit 10 amplifies the received differential voltage and converts it from an analog signal into a digital signal by a semiconductor component 6 such as a comparator circuit. Here, a chip component 7 including a filter circuit such as a damping resistor, a low-pass filter, a high-pass filter, a band-pass filter, a band-stop filter, a common-mode filter, or the like, may be provided in the reception circuit 10 for noise handling, or the like. In addition, the reception circuit 10 may have a combiner for synthesizing a plurality of received signals. The digital signals output from the reception circuit 10 are used for various signal processing.

The differential transmission path 2 is formed of a flat cable, a flexible board, a printed circuit board, or the like. For example, the differential transmission path 2 has a structure having a pair of microstrip-structured or coplanar-structured differential signal lines, formed on an insulating member such as FR-4. The pair of differential signal lines in the differential transmission path 2 has differential signals from the transmission circuit 1 applied thereto. The pair of differential signal lines may be formed on an inner layer of the multi-layer board or may be formed on a surface layer. In a case where the pair of differential signal lines is formed on the surface layer, it is preferred to perform treatment such as covering the differential signal lines with resist material or the like as a protecting member. A ground (GND) layer is formed on a surface opposite to the surface on which the pair of differential signal lines of the differential transmission path 2 is provided.

Additionally, in the differential transmission path 2, the width (differential signal line width) of respective differential signal lines or the distance (signal line distance) between the differential signal lines are determined to exhibit a desired characteristic impedance. As described above, one end of the pair of differential signal lines is terminated by the terminating circuit 3 and the other end has the transmission circuit 1 connected thereto. The differential signal line width and the signal line distance of the pair of differential signal lines are determined so that the differential impedance turns out to be 100Ω, for example. However, the differential signal line width and the signal line distance are not particularly limited, provided that they are compatible with the transmission circuit 1 and the terminating circuit 3. In addition, in a case where it is desired to form the differential transmission path 2 to be longer, it can be realized by connecting a plurality of boards as illustrated in FIGS. 1A to 1C. On this occasion, on each board to be connected, as long as the differential signal line has a substantially identical differential characteristic impedance and is electrically connected, no limitation is imposed on the electric material constant and the layer configuration of the board.

The differential coupler 4 is a directional coupler having the reception circuit 10 connected to one end of the differential signal line and the other end terminated by the terminating circuit (not illustrated), as illustrated in FIGS. 1A to 1C. However, without being limited thereto, there may be a configuration in which, for example, both ends of the differential signal line of the differential coupler 4 are kept electrically open and the reception circuit 10 is connected to a predetermined position of the differential signal line. Additionally, in any of the differential couplers 4, the length of the differential signal line is shorter than the length of the differential transmission path 2 and is adjusted by the transmission rate of differential signals. The differential coupler 4 receives, via electromagnetic field coupling, a differential signal applied between differential signal lines of differential transmission path 2. The differential coupler 4 is connected to the reception circuit 10 via the wired transmission path 5 in order to supply the received differential signal to the reception circuit 10.

The wired transmission path 5 for connecting the differential coupler 4 and the reception circuit 10 may be formed of a printed circuit board or a Molded Interconnect Device (MID) similarly to the differential transmission path 2. In addition, the length of the transmission path 5 is desired to be equal to or shorter than one-sixth of the wavelength of the fundamental wave of the communication rate via electromagnetic field coupling between the differential transmission path 2 and the differential coupler 4. Limiting the transmission path to the length as described above allows for suppressing the effect of parasitic components generated in the transmission path 5.

As illustrated in FIGS. 1A to 1C, the reception circuit 10 and the differential transmission path 2 are provided and held at an angle so that the reception circuit 10 does not couple with the differential transmission path 2. As will be explained in FIG. 7A, the angle θ formed by the reception circuit 10 and the differential transmission path 2 may be selected to provide good separation. In other words, the board of the reception circuit 10 is provided to be inclined (FIG. 1A) or upright (FIG. 1B) with respect to the differential signal line of the reception circuit 10, so as to separate away from the direction in which the pair of differential signal lines provided along the differential transmission path 2 extends. Here, an upright state refers to a case where the inclination angle with respect to the differential signal line of the reception circuit 10 is 90 degrees. A holding mechanism (not illustrated) that holds the differential transmission path 2 and the reception circuit 10 in the aforementioned manner may be any mechanism that holds the both, while maintaining a constant angle therebetween, and various configurations are considered. For example, the differential coupler 4 and the reception circuit 10 may be connected by a right-angle type connector or the like, or the differential coupler 4 and the reception circuit 10 may be connected by a rigid-flexible board or the like. Here, although the differential coupler 4 is provided on the upper surface (the surface further from the differential transmission path) of the board provided along the differential transmission path 2 in FIG. 1B, the differential coupler 4 may be provided on the lower surface (the surface facing the differential transmission path) of the board.

FIG. 1C illustrates an example of the wireless communication system 100 in a case where the receiver 102 is formed using a rigid-flexible board. The rigid-flexible board is formed of a rigid part and a flexible part. The rigid part has, implemented thereon, the reception circuit 10 including the semiconductor component 6 and the chip component 7, and the flexible part has the differential coupler 4 formed thereon. The rigid part is integrally formed by laminating flexible layers and rigid layers, with the differential coupler 4 and the reception circuit 10 being connected in the inner layer of the rigid part by a via, the transmission path, or the like. An adhesion layer or the like is used to form the flexible layer and the rigid layer into an integrated lamination. There is a risk that the adhesion layer may protrude from the connecting surface of the rigid part and the flexible part when forming the integrated lamination. Therefore, the differential coupler 4 of the flexible part is provided in a manner bent from a position separated from the rigid part by a certain distance, for example, approximately 1 mm, to be substantially parallel with the curved differential transmission path 2. On this occasion, the method for maintaining the shape of the flexible part is not particularly limited. In addition, although FIG. 1C illustrates a configuration in which two flexible layers are drawn from one side, there may also be a single-layer configuration, with electronic components or the like being installed on the flexible layer. In addition, although FIG. 1C illustrates a configuration in which the board of the reception circuit 10 is upright with respect to the differential signal line of the reception circuit 10, there may also be a configuration in which the board of the reception circuit 10 is inclined with respect to the differential signal line of the reception circuit 10, similarly to FIG. 1A.

As described above, the wireless communication system 100 of the first embodiment includes the differential transmission path 2 having a first differential signal line, and the differential coupler 4 having a second differential signal line which is electromagnetic field coupled with the first differential signal line to perform wireless communication of differential signals. The differential transmission path 2 and the differential coupler 4 respectively have connected thereto an electronic circuit (transmission circuit 1 and reception circuit 10) for processing differential signals. The surface of the board (or ground pattern), of the electronic circuit (reception circuit 10) connected to the differential coupler 4 via the wired transmission path 5 to process differential signals, is provided to be inclined or upright with respect to the second differential signal line, so as to separate away from the direction in which the first differential signal line extends. Here, although the first embodiment has been described with an example using the differential transmission path 2 as the transmission coupler, a differential coupler may also be used as the transmission coupler. Furthermore, it is also possible to use the differential coupler 4 as a transmission coupler, and the differential transmission path 2 as a reception coupler. In this case, the electronic circuit connected to the differential coupler 4 turns out to be a transmission circuit that supplies differential signals, and the electronic circuit connected to the differential transmission path 2 turns out to be a reception circuit that receives differential signals.

In addition, the differential transmission path 2 and the differential coupler 4 are provided to be relatively movable to each other. For example, the differential transmission path 2 is provided at the moving/rotating side, and the differential coupler 4 is provided at the fixed side. Alternatively, the differential transmission path 2 is provided at the fixed side, and the differential coupler 4 is provided at the moving/rotating side. There may be mentioned a configuration as a preferred example, in which the differential transmission path 2 is provided on the rotation unit (gantry) of the CT apparatus, the differential coupler 4 is provided on the fixed portion, and X-ray information is transmitted from the rotation unit to the fixed portion. Such a CT apparatus will be described in a fourth embodiment, referring to FIG. 6.

In addition, electromagnetic field coupling in the present embodiment and the embodiments described below includes both electric field coupling and magnetic field coupling. In other words, wireless communication between couplers may be performed via electric field coupling, via magnetic field coupling, or via both electric field coupling and magnetic field coupling. Magnetic field coupling includes electromagnetic induction and magnetic field resonance. The following description focuses on a case where wireless communication is performed mainly via electric field coupling. In addition, although operations and effects of each of the following embodiments will be described referring to the configuration illustrated in FIGS. 1A and 1B, they are also applicable to the configuration of FIG. 1C. In other words, the wireless communication system 100 illustrated in FIG. 1C may be configured equivalently to the wireless communication system 100 illustrated in FIGS. 1A and 1B, except that the differential coupler 4 and the transmission path 5 in FIGS. 1A and 1B are formed of flexible parts.

The effect of improved communication performance of the wireless communication system according to the first embodiment will be described referring to calculation results obtained by simulation. An electromagnetic field simulator is used to calculate the S-parameter between the differential transmission path and the differential coupler, and analysis of transmission voltage waveform is performed using a circuit simulator. FIGS. 2A to 2F illustrate eye patterns obtained as simulation results.

A simulation model used in the aforementioned simulation will be described. The differential transmission path 2 is adjusted to have a relative permittivity of 2.17 and a dielectric loss tangent of 0.0005, assuming a fluorine resin board frequently used for high-speed transmission as a base member. The thickness of the base member is 1.6 mm and the copper foil thickness forming conductor patterns is 35 μm. In addition, the differential signal line width of the differential transmission path 2 is 4.8 mm, and the signal line distance is 5.0 mm, with a ground pattern (hereinafter, GND pattern) provided on the back surface of the differential transmission path 2. In addition, the length of the differential transmission path 2 is set to 300 mm. The differential coupler 4 has the same base member, copper foil thickness, differential signal wiring width, and signal-wiring distance as those of the differential transmission path 2. The differential signal wiring of the differential transmission path 2 and the conductor pattern of the differential coupler 4 are arranged to correctly face each other with a gap of 5 mm. For the reception circuit 10, only a 30×30 mm GND pattern is modeled. A port (connecting part) is set between the GND pattern of the reception circuit 10 and the differential coupler 4 to calculate the S-parameter for each angle by the circuit simulator, using the angle θ formed by the differential transmission path 2 and the surface of the GND pattern as a parameter. A waveform simulation with a 10 Gbps transmission rate has been performed using the S-parameter calculated by the circuit simulator as described above.

Figure 7A:
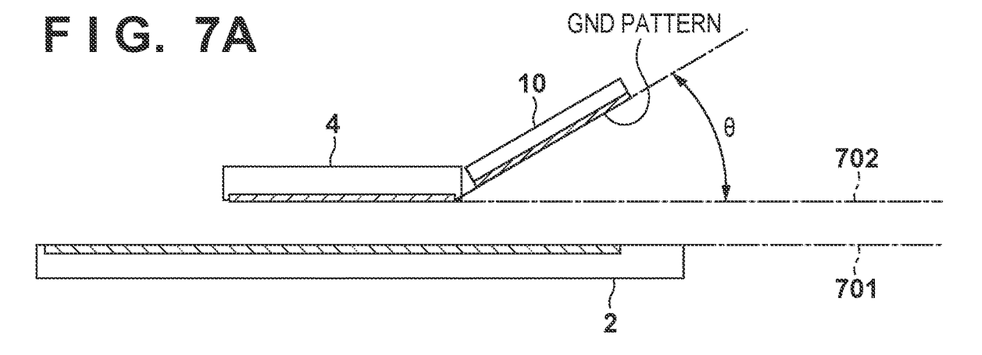
FIGS. 7A to 7B are explanatory diagrams of an inclination angle between a differential coupler and a reception circuit.

The inclination angle (angle θ) used in the simulation will be described, referring to FIG. 7A. The differential transmission path 2 and the differential signal line of the differential coupler 4 are parallel to each other. The angle θ is the angle between a direction 702 of the differential signal line of the reception circuit 10 and the surface of the board or GND pattern of the reception circuit 10. In addition, the direction of inclination of the reception circuit 10 is the direction separating away from a direction 701 in which the differential signal line of the differential transmission path 2 extends.

Figure 2A:
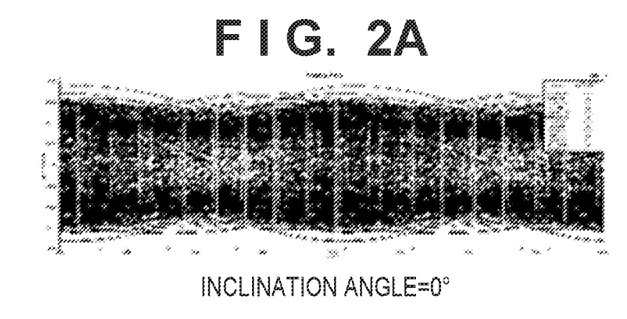
FIGS. 2A to 2F illustrate simulation results of eye pattern waveforms.
Figure 2B:
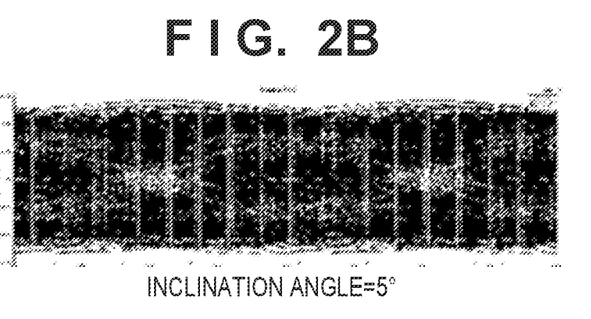
Figure 2C:
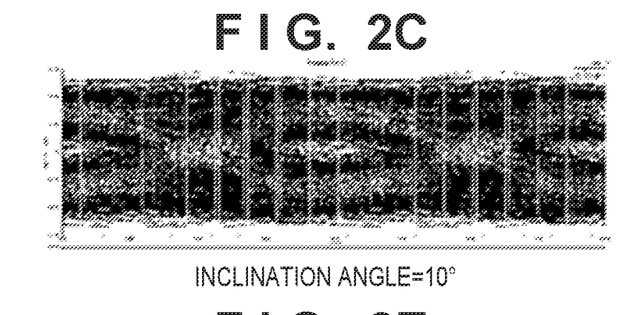
Figure 2D:
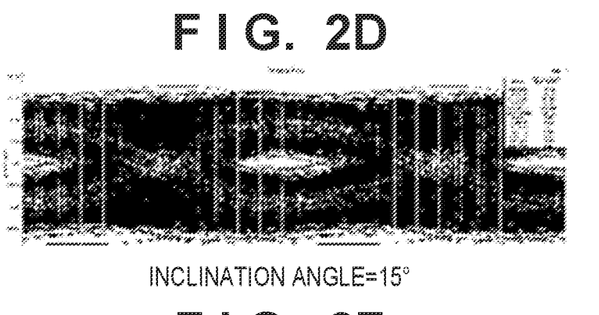
Figure 2E:
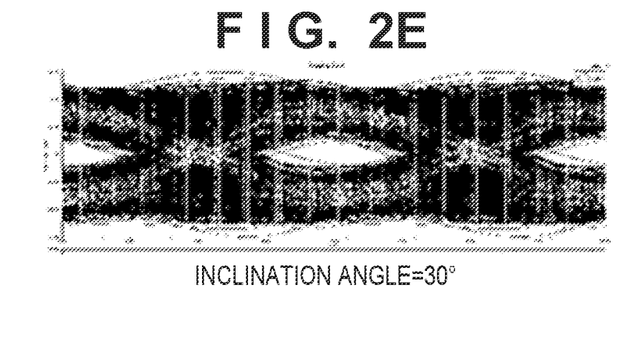
Figure 2F:
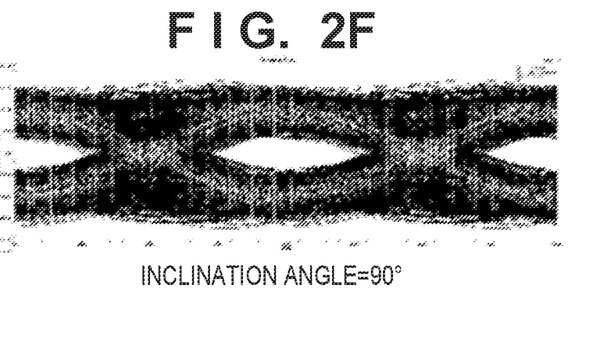
Figure 3:
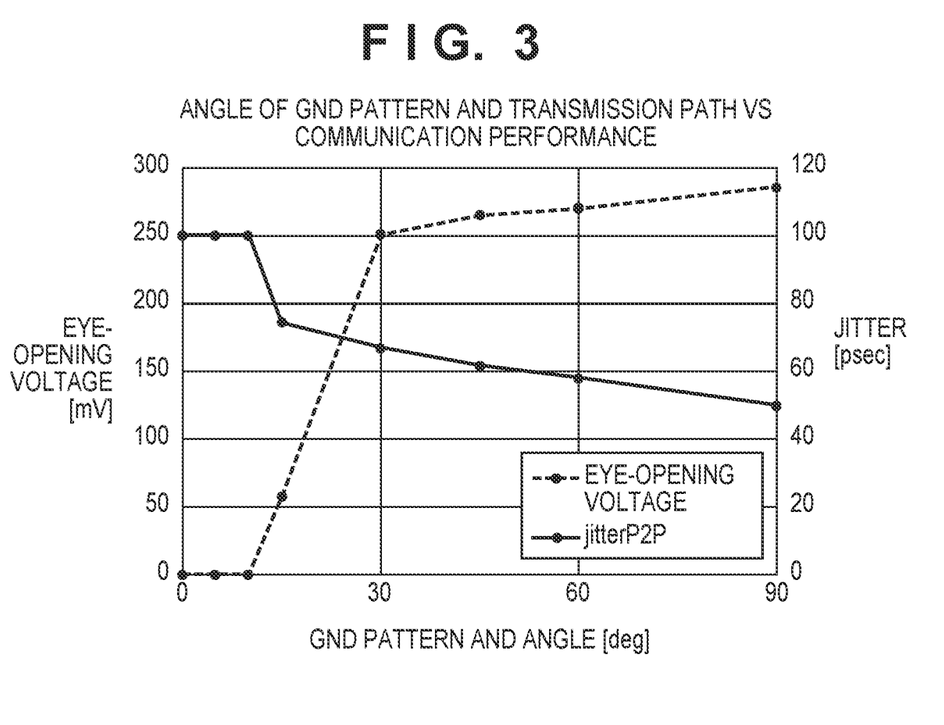
FIG. 3 illustrates a simulation result of communication performance.

FIG. 2A illustrates an eye pattern in a case where the angle θ formed by the differential transmission path 2 and the GND pattern is zero degrees, FIG. 2B is a case of 5 degrees, FIG. 2C is a case of 10 degrees, FIG. 2D is a case of 15 degrees, FIG. 2E is a case of 30 degrees, and FIG. 2F is a case of 90 degrees. A graph putting together the simulation results is illustrated in FIG. 3. In FIG. 3, the horizontal axis indicates the angle θ formed by the differential transmission path 2 and the GND pattern. In addition, the left vertical axis indicates the eye-opening voltage to which the dashed-line graph corresponds. The right vertical axis indicates jitter values from peak to peak, to which the solid-line graph corresponds. It can be seen from FIGS. 2A to 2F and FIG. 3 that, when the angle θ formed by the differential transmission path 2 and the GND pattern (reception circuit 10) becomes equal to or larger than 30 degrees, the eye-opening voltage reaches 250 mV or higher, whereby the eye is open. In addition, it can also be seen that jitter becomes 0.7 Unit Interval (UI) or less when the angle formed between the differential transmission path 2 and the GND pattern (reception circuit 10) is 30 degrees or more and 150 degrees or less, thereby enabling communication. In addition, it can be seen from the results of the simulation described above that the communication performance becomes best when the angle θ of the differential transmission path 2 and the GND pattern of the reception circuit 10 is 90 degrees.

Here, in order to consider the shape of the GND pattern of the reception circuit 10, the simulation has been performed while gradually shortening the length of the GND pattern in the longitudinal direction of the differential transmission path 2 from 30 mm to about 1 mm, when the angle θ is zero. As a result, there has been almost no improvement of the eye pattern even when the length of the GND pattern is shortened, and the eye-opening voltage has remained substantially close to zero. The foregoing suggests that the cause of degradation of communication performance is due to the positive potential side and the negative potential side of the differential signal wiring coupling with the GND pattern of the reception circuit 10 via electrostatic capacitance, and thus reducing difference signals. Therefore, it is difficult to increase the speed by down-sizing of the GND pattern, and it is more effective to configure the reception circuit 10 (GND pattern) in manner having an angle in a direction separating away from the differential transmission path 2.

As described above, the wireless communication system 100 of the first embodiment reduces unnecessary coupling between the reception circuit 10 and the differential transmission path 2, resulting in less deformation of transmission waveform and improved communication quality. As a result, it is possible to realize high-speed wireless communication.

Second Embodiment

Although there has been described in the first embodiment a wireless communication system 100 including: the differential transmission path 2 having a pair of differential signal lines; and the single differential coupler 4, it is possible to provide a wireless communication system that supports multiple channels, using a plurality of pairs of differential signal lines and a plurality of the differential couplers 4.

Figure 4:
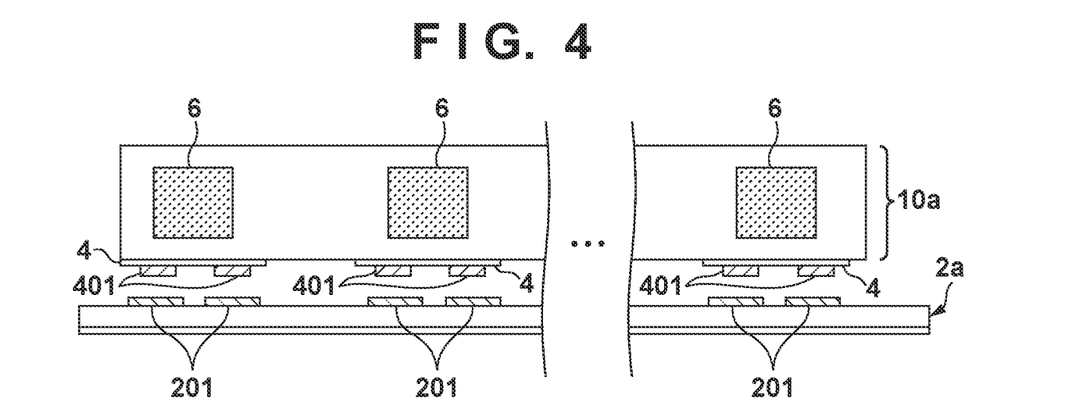
FIG. 4 illustrates an exemplary configuration of a wireless communication system according to a second embodiment.

FIG. 4 is an explanatory diagram of a configuration of a wireless communication system according to a second embodiment. In FIG. 4, a differential transmission path 2a extends in a direction from the front side to the back side of the page. The differential transmission path 2a has a plurality of pairs of differential signal lines 201. The plurality of differential couplers 4 each having a pair of differential signal lines 401 are provided so as to face each of the plurality of pairs of differential signal lines 201. A reception circuit 10a, which is provided in a manner forming a predetermined angle (30 degrees or more and 150 degrees or less) with respect to the differential transmission path 2a, includes a plurality of the semiconductor components 6 corresponding to the plurality of differential couplers 4. As described above, according to the second embodiment, it is possible to provide a wireless communication system 100 that supports an arbitrary number of channels with improved communication quality.

Figure 7B:
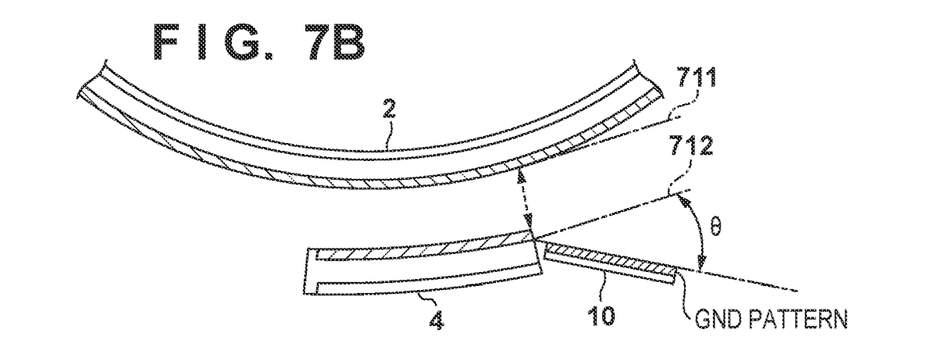

Note that, although the first and second embodiments have described a case where the differential transmission path 2 and the differential signal line of the differential coupler 4 extend linearly, the differential transmission path 2 and the differential signal line of the differential coupler 4 may extend in an arc-shaped manner Note that in the present specification, an arc shape includes a circular arc, an elliptical arc, a curved shape, or the like. FIG. 7B is an explanatory diagram of an example of an angle θ of the reception circuit 10 with respect to the differential coupler 4 in a configuration as described above. FIG. 7B illustrates the arc-shaped differential transmission path 2 and the arc-shaped differential coupler 4. The angle of inclination of the reception circuit 10 is the angle θ between a tangential direction 712 of the differential signal line and the reception circuit 10 (e.g., board or GND pattern) in the vicinity of the port position of the reception circuit in the differential coupler 4. The port position is a connecting part (signal acquisition position) between the differential signal line of the differential coupler 4 and the transmission path 5. In addition, the inclination direction of the reception circuit 10 is a direction separating away from a direction 711 of the tangent line in the vicinity of the position, corresponding to the port position, of the differential signal line of the differential transmission path 2.

Third Embodiment

In the first embodiment, there has been described a wireless communication system 100 in which one of the transmission coupler and the reception coupler is formed of a differential transmission path, and the other is formed of a differential coupler. In a third embodiment, there will be described a wireless communication system 100 in which both the transmission coupler and the reception coupler are formed of differential couplers.

Figure 5A:
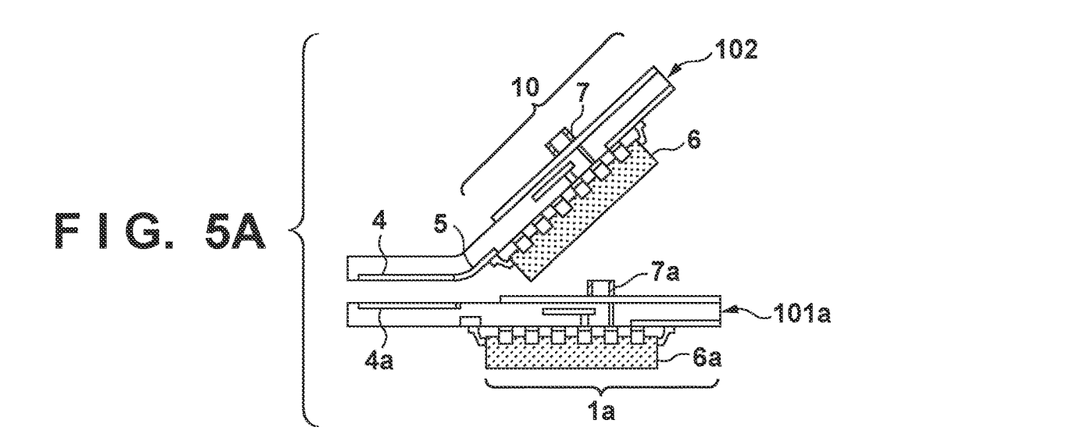
FIGS. 5A to 5C illustrate exemplary configurations of a wireless communication system according to a third embodiment.
Figure 5B:
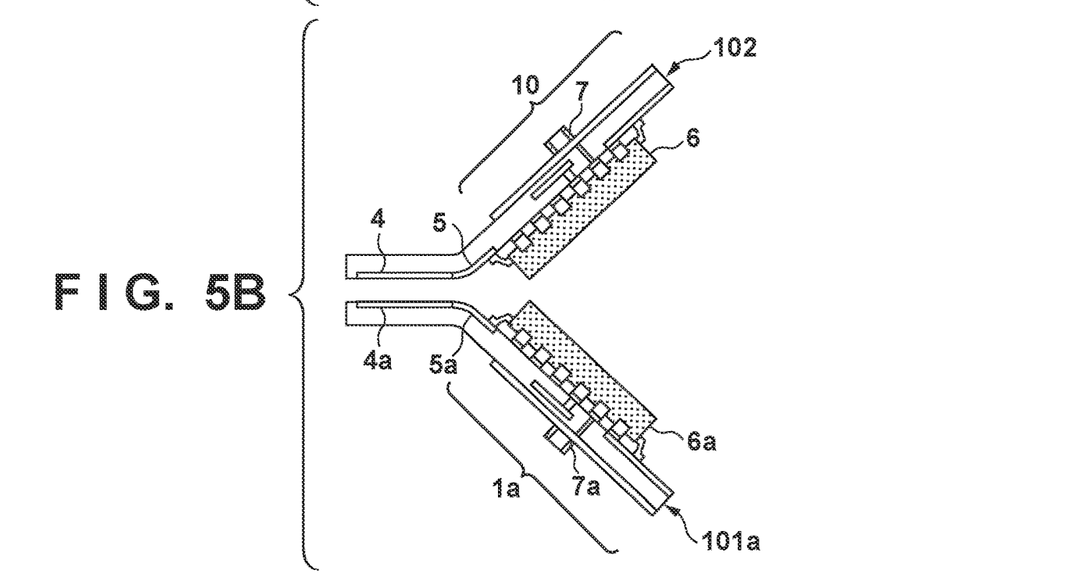
Figure 5C:
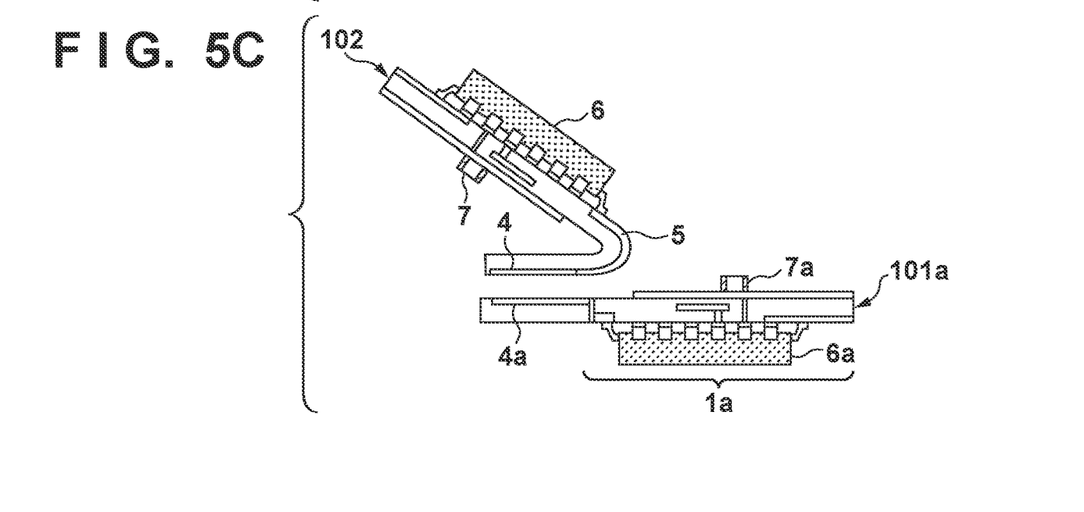

FIGS. 5A to 5C illustrate a wireless communication system 100a according to the third embodiment. In FIG. 5A, the configuration of the receiver 102 including the differential coupler 4, the transmission path 5, and the reception circuit 10 is similar to that of the first embodiment (FIGS. 1A and 1B). A transmitter 101a includes: a transmission circuit 1a having a semiconductor component 6a and a chip component 7a; and a differential coupler 4a. In this configuration, it is preferred that the angle formed between the direction in which the differential signal line of the differential coupler 4a extends and the reception circuit 10 (e.g., board of reception circuit, or GND pattern) held in a range between 30 degrees or more and 150 degrees or less.

In FIG. 5B, the reception circuit 10 of the receiver 102 is provided to be inclined at a predetermined angle with respect to the direction in which the differential signal line of the transmission circuit 1a extends, and the transmission circuit 1a of the transmitter 101a is also provided to be inclined at a predetermined angle with respect to the direction in which the differential signal line of the differential coupler 4 extends. FIG. 5C illustrates an example in which the reception circuit 10 of the receiver 102 is provided at an angle exceeding 90 degrees with respect to the direction in which the differential signal line of the transmission circuit 1a extends. Note that in FIGS. 5A to 5C, the reception circuit 10 may be perpendicular to the direction in which the differential signal line extends. Also, in FIG. 5B, both the reception circuit 10 and the transmission circuit 1a may be perpendicular to the direction in which the differential signal line extends. In addition, note that in FIGS. 5A and 5C, the receiver 102 and the transmitter 101a may be exchanged. In other words, the transmission circuit 1a of the transmitter 101a may be provided to be inclined or upright with respect to the direction in which the differential signal line extends.

As described above, in a configuration in which the transmission coupler and the reception coupler are formed of differential couplers in the third embodiment, the angle formed between a differential signal line of one of the differential couplers and a GND pattern of the reception circuit 10 connected to the other one of the differential couplers is set to be 30 degrees or more and 150 degrees or less. According to the wireless communication system 100a configured as described above, it is possible to improve communication quality similarly to the first embodiment.

Fourth Embodiment

In a fourth embodiment, there will be described an example of a computer tomography apparatus (hereinafter CT apparatus) to which the aforementioned wireless communication system 100 is applied.

Figure 6:
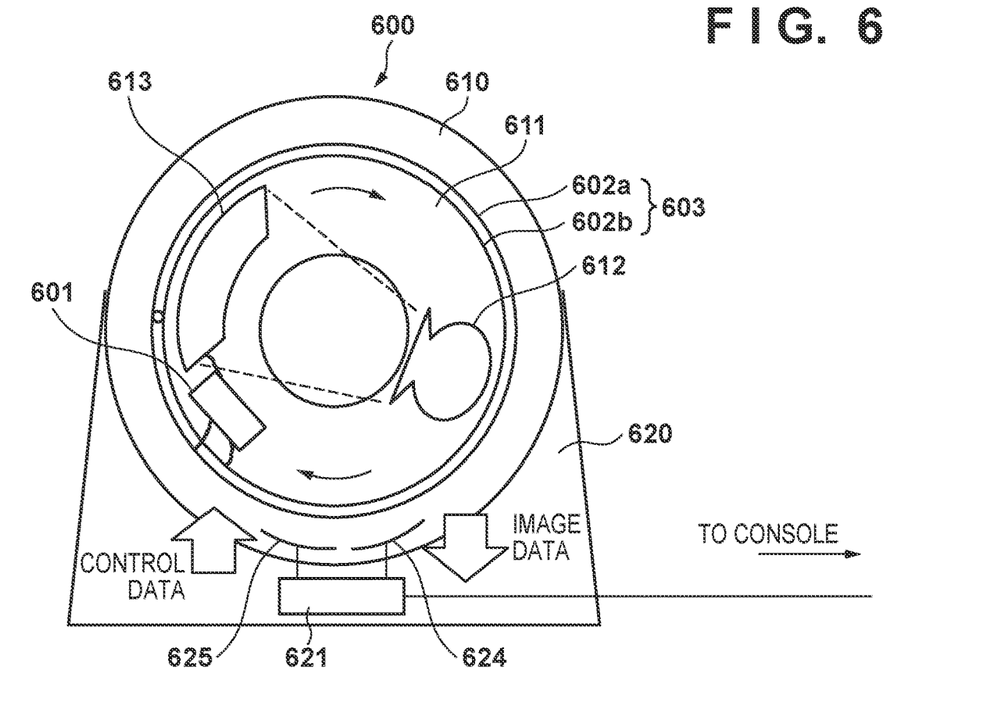
FIG. 6 illustrates an exemplary configuration of a CT apparatus according to a fourth embodiment.

FIG. 6 illustrates a general configuration of a CT apparatus 600 according to the fourth embodiment. The CT apparatus 600 includes a gantry 610 having a rotation unit 611 and a fixed portion 620 supporting the gantry 610. The rotation unit 611 rotates inside the gantry 610. The rotation unit 611 has provided therein an X-ray tube 612 as an example of a radiation generator and an X-ray detector 613 as an example of a radiation detector, in a manner facing each other. The X-ray detector 613 detects X-rays generated by the X-ray tube 612. In addition, the rotation unit 611 has provided therein a differential transmission path 603 having a pair of differential signal lines 602a and a pair of differential signal lines 602b for performing wireless communication via electromagnetic field coupling, in a manner conforming to a circumference centered around the rotation axis of the rotation unit 611. The differential transmission path 603 corresponds to the differential transmission path 2 of the first embodiment or the differential transmission path 2a of the second embodiment. In addition, a rotation unit transmission unit 601 provided on the rotation unit 611 has a function as the transmission circuit 1 described above and supplies X-ray detection signals obtained from the X-ray detector 613 to the differential transmission path 603.

The fixed portion 620 includes a receiver 624 that receives and digitizes signals from the differential signal line 602a via electromagnetic field coupling with a pair of differential signal lines 602a of the differential transmission path 603. In addition, the fixed portion 620 includes a fixed portion transmission unit 621 that transmits digital signals (X-ray data) obtained by the receiver 624 to the console. The receiver 624 corresponds to the receiver 102 explained in the first embodiment or the second embodiment described above.

According to the configuration as described above, while the rotation unit 611 is rotating, signals obtained by the X-ray detector 613 are transmitted from the differential transmission path 603 to the receiver 624 via electromagnetic field coupling. As described above in the first and second embodiments, the reception circuit included in the receiver 624 has an angle of 30 degrees or more and 150 degrees or less with respect to (tangential direction of) the differential transmission path 603, whereby high-speed wireless communication is realized due to good communication quality.

The foregoing is a configuration for transmitting signals (e.g., X-ray data) from the rotation unit 611 to the fixed portion 620. Furthermore, the CT apparatus 600 is configured to transmit signals (e.g., control data) from the fixed portion 620 to the rotation unit 611. In FIG. 6, a transmitter 625 includes a differential coupler that functions as a transmission coupler. The pair of differential signal lines 602b of the differential transmission path 603 provided on the rotation unit 611 are electromagnetic field coupled with the differential coupler of the transmitter 625 and function as a reception coupler. For example, the control data transmitted from the console is output as control signals from the fixed portion transmission unit 621, which also functions as the transmission circuit 1, and is transmitted from the differential coupler of the transmitter 625 to the differential signal line 602b via electromagnetic field coupling. The control signals received at the differential signal line 602b are supplied to the rotation unit transmission unit 601, which also functions as the reception circuit 10. As described in the aforementioned embodiments, the transmission circuit of the transmitter 625 has an angle of 30 degrees or more and 150 degrees or less with respect to (tangential direction of) the differential transmission path 603, for example, whereby high-speed communication is realized due to good communication quality.

As described above, according to the fourth embodiment, high-speed and high-quality communication between the rotation unit and the fixed portion in the CT apparatus is realized by wireless communication via electromagnetic field coupling. Note that although a CT apparatus has been taken as an example of application of the wireless communication system illustrated in the first to third embodiments, it is needless to say that the disclosure is not limited thereto.

As described above, the aforementioned embodiments allow for suppressing degradation of communication quality in wireless communication via electromagnetic field coupling.

OTHER EMBODIMENTS

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-194729, filed Oct. 25, 2019, which is hereby incorporated by reference herein in its entirety.

What is claimed is:

1. A wireless communication system comprising:
a differential signal line;
a first differential coupler to perform wireless communication of a differential signal with the differential signal line via electromagnetic field coupling; and
an electronic circuit having a board or a ground pattern and connected to the first differential coupler via a wired transmission path to process the differential signal, wherein
a surface of the board or the ground pattern is inclined or upright with respect to the first differential coupler so as to separate away from a direction in which the differential signal line extends.

2. The system according to claim 1, wherein the board of the electronic circuit is provided at an angle of 30 degrees or more and 150 degrees or less with respect to the direction in which the differential signal line extends.

3. The system according to claim 1, wherein a length of the wired transmission path connecting the first differential coupler and the electronic circuit is equal to or less than one-sixth of a wavelength of a fundamental wave of a communication rate due to the electromagnetic field coupling.

4. The system according to claim 1, wherein the differential signal line is provided on a differential transmission path, and the differential signal line extends longer than the first differential coupler.

5. The system according to claim 4, wherein
the differential transmission path functions as a transmission coupler,
the first differential coupler functions as a reception coupler, and
the electronic circuit is configured to process the differential signals received by the first differential coupler.

6. The system according to claim 4, wherein
the differential transmission path functions as a reception coupler, and
the first differential coupler functions as a transmission coupler, wherein
the electronic circuit is configured to supply the differential signals to the differential signal line.

7. The system according to claim 4, wherein the first differential coupler relatively moves along the differential transmission path.

8. The system according to claim 1, wherein the differential signal line is provided on a second differential coupler which is different from the first differential coupler.

9. The system according to claim 1, wherein the differential signal line and the first differential coupler are arc-shaped, and the electronic circuit is provided to be inclined with respect to a tangential direction of a connecting part with the wired transmission path.

10. The system according to claim 1, wherein
the first differential coupler and the wired transmission path are provided on a flexible part of a rigid-flexible board, and
the electronic circuit is provided on a rigid part of the rigid-flexible board.

11. A computer tomography apparatus comprising:
a radiation generator;
a radiation detector configured to detect radiation generated by the radiation generator;
a rotation unit configured to rotate the radiation generator and the radiation detector while holding the same in a state facing each other;
a fixed portion configured to support the rotation unit; and
a wireless communication system,
the wireless communication system including:
a differential signal line;
a differential coupler to perform wireless communication of differential signals with the differential signal line via electromagnetic field coupling; and
an electronic circuit connected to the differential coupler via a wired transmission path to process the differential signals, wherein
a surface of a board or a ground pattern of the electronic circuit is inclined or upright with respect to the differential coupler so as to separate away from the direction in which first differential signal line extends,
the differential signal line is provided along a circumference centered on a rotation axis of the rotation unit, and
the differential coupler is provided on the fixed portion, and
a signal detected by the radiation detector is transmitted to the fixed portion via electromagnetic field coupling between the differential signal line and the differential coupler.

* * * * *